(12) United States Patent  
Gallo et al.

(10) Patent No.: US 7,206,240 B2
(45) Date of Patent: Apr. 17, 2007

(54) FAST SENSING SCHEME FOR FLOATING-GATE MEMORY CELLS

(75) Inventors: Girolamo Gallo, Avezzano (IT); Tommaso Vali, Sezze (IT); Giulio Giuseppe Marotta, Contigliano (IT)

(73) Assignee: Micron Technology, Inc., Boise, ID (US)

( * ) Notice: Subject to any disclaimer, the term of this patent is extended or adjusted under 35 U.S.C. 154(b) by 275 days.

(21) Appl. No.: 10/787,911

(22) Filed: Feb. 25, 2004

(65) Prior Publication Data

US 2004/0165464 A1 Aug. 26, 2004

Related U.S. Application Data

(62) Division of application No. 10/218,677, filed on Aug. 14, 2002, now Pat. No. 6,822,904.

(30) Foreign Application Priority Data

| Jan. 3, 2001 | (IT) | .................. RM2001A0001 |
| Aug. 29, 2001 | (IT) | .................. RM2001A0514 |

(51) Int. Cl.  
*G11C 7/02* (2006.01)

(52) U.S. Cl. .................. 365/207; 365/205; 365/185.25

(58) Field of Classification Search ................ 365/207, 365/205, 185.25  
See application file for complete search history.

(56) References Cited

U.S. PATENT DOCUMENTS

| 4,727,519 A | 2/1988 | Morton |
| 4,763,026 A | 8/1988 | Tsen |
| 5,504,443 A * | 4/1996 | Gross et al. .................. 327/51 |
| 5,625,588 A | 4/1997 | Seyyedy |
| 5,828,610 A * | 10/1998 | Rogers et al. .............. 365/203 |
| 5,949,728 A | 9/1999 | Liu |
| 5,999,439 A | 12/1999 | Seyyedy |
| 6,049,494 A * | 4/2000 | Sakui et al. ................ 365/203 |
| 6,128,226 A | 10/2000 | Eitan |
| 6,301,175 B1 | 10/2001 | Seyyedy |
| 6,411,550 B1 | 6/2002 | Nasu |
| 6,522,594 B1 * | 2/2003 | Scheuerlein ................ 365/206 |
| 6,671,206 B2 * | 12/2003 | Vali et al. .............. 365/185.21 |
| 6,687,161 B2 * | 2/2004 | Marotta et al. ........ 365/185.21 |
| 6,703,870 B2 * | 3/2004 | Chung et al. .................. 327/51 |
| 6,845,047 B2 * | 1/2005 | Ikehashi et al. ....... 365/189.01 |
| 6,914,821 B2 * | 7/2005 | Vali et al. .............. 365/185.21 |
| 2002/0008549 A1 | 1/2002 | Forbes |

* cited by examiner

*Primary Examiner*—Tuan T. Nguyen  
(74) *Attorney, Agent, or Firm*—Leffert, Jay & Polglaze P.A.

(57) ABSTRACT

Sensing circuits are adapted for faster sensing of a programmed state of a floating-gate memory cell. The sensing circuits include a first precharging path for applying a first precharge potential to the input node of a sensing device for precharging bit lines prior to sensing the programmed state of the floating-gate memory cell. The sensing circuits further include a second precharging path for applying a second precharge potential to a target global bit line for precharging bit lines prior to sensing the programmed state of the floating-gate memory cell. The second precharging path is activated during only a portion of the precharging phase of a sensing operation to bring the bit lines rapidly up toward an asymptotic potential level. The second precharging path is thus deactivated prior to deactivating the first precharging path.

24 Claims, 4 Drawing Sheets

FAST SENSING SCHEME FOR FLOATING-GATE MEMORY CELLS

RELATED APPLICATIONS

This is a divisional application of U.S. patent application Ser. No. 10/218,677, titled "FAST SENSING SCHEME FOR FLOATING-GATE MEMORY CELLS," filed Aug. 14, 2002, now U.S. Pat. No. 6,822,904 issued on Nov. 23, 2004, which application is assigned to the assignee of the present invention and the entire contents of which are incorporated herein by reference, and which application claims priority to Italian Patent Application Serial No. RM2001A000001, filed Jan. 3, 2001, entitled "Sensing Scheme for Low-Voltage Flash Memory" and its corresponding U.S. patent application Ser. No. 10/036,751, filed Dec. 21, 2001 of the same title, now U.S. Pat. No. 6,687,161 issued on Feb. 3, 2004, as well as Italian Patent Application Serial No. RM2001A000514, filed Aug. 29, 2001, entitled "Fast Sensing Scheme for Floating-Gate Memory Cells," which are commonly assigned, where the Ser. No. 10/218, 677 application is a continuation-in-part of the aforementioned Ser. No. 10/036,751 application, which is also incorporated herein by reference.

TECHNICAL FIELD OF THE INVENTION

The present invention relates generally to semiconductor memory devices, and in particular, the present invention relates to sensing schemes in a flash memory device.

BACKGROUND OF THE INVENTION

Semiconductor memory devices are rapidly-accessible memory devices. In a semiconductor memory device, the time required for storing and retrieving information generally is independent of the physical location of the information within the memory device. Semiconductor memory devices typically store information in a large array of cells. A group of cells are electrically connected together by a bit line, or data line. An electrical signal is used to program a cell or cells.

Computer, communication and industrial applications are driving the demand for memory devices in a variety of electronic systems. One important form of semiconductor memory device includes a non-volatile memory made up of floating-gate memory cells called flash memory. Computer applications use flash memory to store BIOS firmware. Peripheral devices such as printers store fonts and forms on flash memory. Digital cellular and wireless applications consume large quantities of flash memory and are continually pushing for lower voltages and power demands. Portable applications such as digital cameras, audio recorders, personal digital assistants (PDAs) and test equipment also use flash memory as a medium to store data.

To achieve lower operating voltages and lower power demands, operation of the memory device must generally come under tighter constraints. Lower operating margins increase the demands on sensing circuits and related circuits for accessing a memory cell and sensing the data contained therein. For example, sensing devices in flash memory devices often rely on a voltage differential to determine the programmed state of a memory cell, such as a voltage differential between a target bit line and a reference voltage. As operating voltages are reduced, such differential sensing devices often must be capable of distinguishing between smaller voltage differentials. At lower voltages, differential sensing becomes slower and, at very low voltages, may even become unreliable.

Read Only Memory (ROM) devices often utilize a single-ended sensing scheme as opposed to differential sensing. A single-ended sensing device has a single input coupled to a target bit line and provides an output signal indicative of a potential level of the target bit line. In operation, the target bit line is precharged to some precharge potential. During or after precharging, the word line of the target memory cell is driven. Upon release from the precharge potential, the logic state of the target memory cell is sensed. If the potential level of the target bit line remains unchanged, it is indicative of no current flow through the target memory cell, thus corresponding to a first logic state. If the potential level of the target bit line falls, it is indicative of current flow through the target memory cell, thus corresponding to a second logic state.

The single-ended sensing device often contains an inverter providing the output signal indicative of the logic state and having a threshold point close to the precharge potential. Choosing a threshold point close to the precharge potential improves the speed of the sensing device by reducing the time necessary to detect the second logic state. Choosing a threshold point close to the precharge potential also improves the power usage of the sensing device by reducing the amount of current necessary to precharge the bit line for the next read cycle. However, choosing a threshold point close to the precharge potential risks erroneous indications of the second logic state if undesired, or residual, current flow is experienced. Such risks have hindered use of single-ended sensing in high-performance flash memory devices, which often experience some residual current due to depletion, leakage, insufficient programming or other phenomena, yet must often perform at lower operating voltages and lower power requirements.

The dominant component of a sensing operation is typically either the time needed to raise a target word line to a read potential or the time needed to raise a target bit line to the precharge potential. As these components of the sensing operation are generally concurrent, the slowest component will generally determine the access time of a memory device. The slowest component of the sensing operation is often the precharge phase. Thus, improvements in the precharge phase can facilitate significant improvements in access time.

For the reasons stated above, and for other reasons stated below which will become apparent to those skilled in the art upon reading and understanding the present specification, there is a need in the art for alternative sensing devices for integrated-circuit memory devices, memory devices containing such sensing devices, and methods of their operation.

SUMMARY OF THE INVENTION

The above-mentioned problems with memory devices and other problems are addressed by the present invention and will be understood by reading and studying the following specification.

Sensing circuits for sensing a programmed state of a floating-gate memory cell have been described for use in memory devices. Sensing circuits in accordance with the various embodiments include a first precharging path for applying a first precharge potential to the input node of a sensing device for precharging bit lines prior to sensing the programmed state of the floating-gate memory cell. Sensing circuits in accordance with the various embodiments further include a second precharging path for applying a second precharge potential to a target global bit line for precharging bit lines prior to sensing the programmed state of the floating-gate memory cell. The second precharging path is activated during only a portion of the precharging phase of a sensing operation to bring the bit lines rapidly up toward an asymptotic potential level. The second precharging path is thus deactivated prior to deactivating the first precharging path.

For one embodiment, the invention provides a sensing circuit. The sensing circuit includes a sensing device having an input node and a first precharging path coupled to the input node. The sensing circuit further includes at least one second precharging path. Each second precharging path is coupled to the input node through a pass circuit.

For another embodiment, the invention provides a flash memory device. The memory device includes a global bit line and a sensing device for sensing a programmed state of a target memory cell. The sensing device includes an input node selectively coupled to the global bit line The sensing device further includes a first precharging path coupled to the input node for precharging the input node and the global bit line during a sensing operation. The memory device further includes a second precharging path coupled to the global bit line for precharging the input node and the global bit line during the sensing operation.

The invention still further provides apparatus of varying scope.

DETAILED DESCRIPTION OF THE INVENTION

In the following detailed description of the present embodiments, reference is made to the accompanying drawings that form a part hereof, and in which is shown by way of illustration specific embodiments in which the inventions may be practiced. These embodiments are described in sufficient detail to enable those skilled in the art to practice the invention, and it is to be understood that other embodiments may be utilized and that process, electrical or mechanical changes may be made without departing from the scope of the present invention. The term substrate used in the following description includes any base semiconductor structure. Examples include silicon-on-sapphire (SOS) technology, silicon-on-insulator (SOI) technology, thin film transistor (TFT) technology, doped and undoped semiconductors, epitaxial layers of a silicon supported by a base semiconductor structure, as well as other semiconductor structures well known to one skilled in the art. Furthermore, when reference is made to a substrate in the following description, previous process steps may have been utilized to form regions/junctions in the base semiconductor structure, and the term substrate includes the underlying layers containing such regions/junctions. The following detailed description is, therefore, not to be taken in a limiting sense, and the scope of the present invention is defined only by the appended claims and equivalents thereof.

Figure 1A:
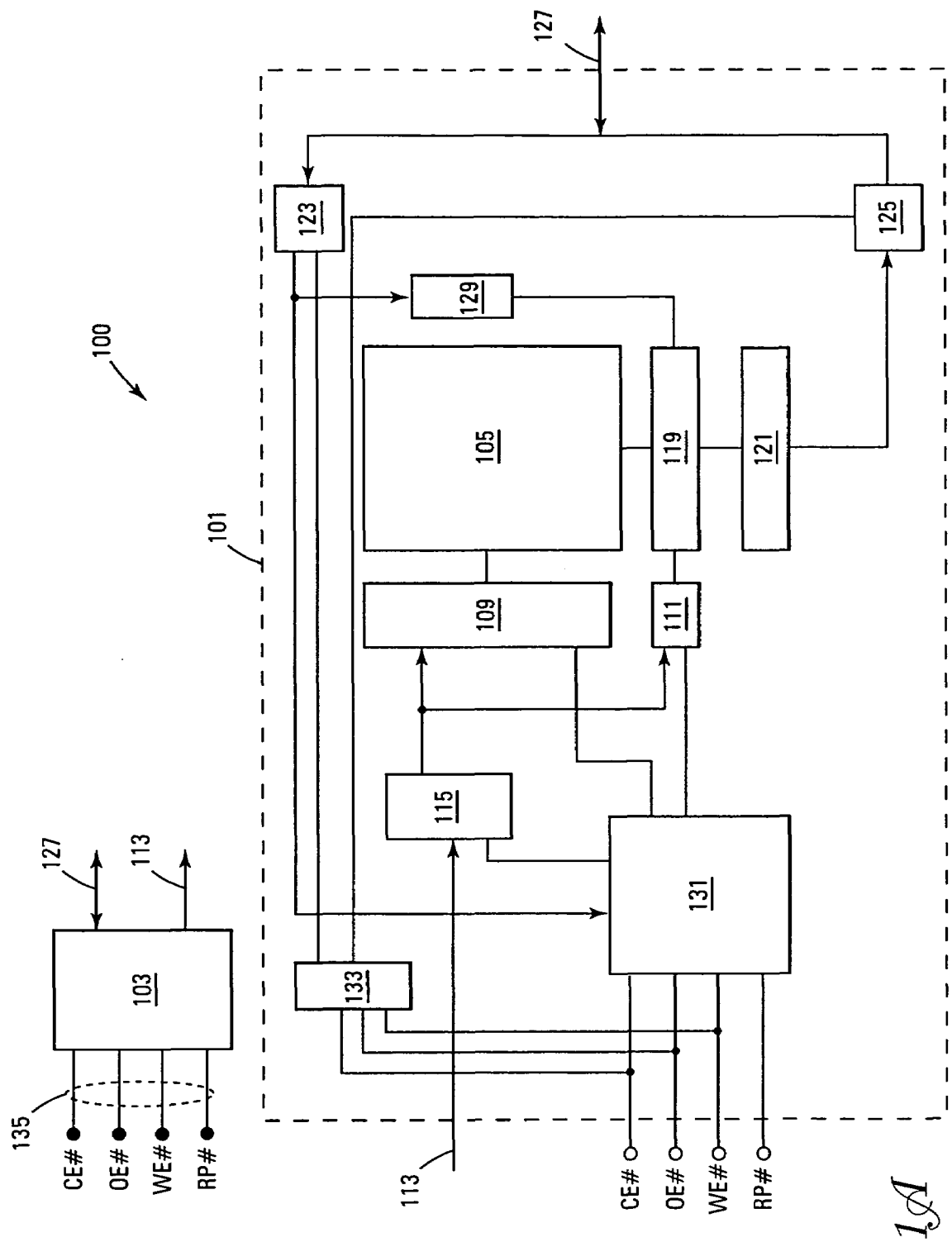
FIG. 1A is a block diagram of a basic flash memory device coupled to a processor as part of an electronic system.

Sensing circuitry in accordance with the various embodiments are adaptable for a variety of memory devices, including flash memory devices. FIG. 1A is a functional block diagram of a basic flash memory device 101 that is coupled to a processor 103. The memory device 101 and the processor 103 may form part of an electronic system 100. The memory device 101 has been simplified to focus on features of the memory that are helpful in understanding the present invention. The memory device 101 includes an array of memory cells 105. The memory cells are preferably non-volatile floating-gate memory cells and generally have their control gates coupled to word lines, drain regions coupled to local bit lines, and source regions commonly coupled to a ground potential. The memory array 105 is arranged in rows and columns, with the rows arranged in blocks. The memory cells generally can be erased in blocks. Data, however, may be stored in the memory array 105 separate from the block structure.

A row decoder 109 and a column decoder 111 are provided to decode address signals provided on address lines A0–Ax 113. An address buffer circuit 115 is provided to latch the address signals. Address signals are received and decoded to access the memory array 105. A column select circuit 119 is provided to select a column of the memory array 105 in response to control signals from the column decoder 111. Sensing circuit 121 is used to sense and amplify data stored in the memory cells. Sensing circuit 121 includes a sensing device in accordance with the various embodiments of the invention. Data input 123 and output 125 buffer circuits are included for bi-directional data communication over a plurality of data (DQ) lines 127 with the processor 103. A data latch 129 is typically provided between data input buffer circuit 123 and the DQ lines 127 for storing data values (to be written to a memory cell) received from the DQ lines 127. Data amplified by the sensing circuit 121 is provided to the data output buffer circuit 125 for output on the DQ lines 127.

Command control circuit 131 decodes signals provided on control lines 135 from the processor 103. These signals are used to control the operations on the memory array 105, including data read, data write, and erase operations. Input/output control circuit 133 is used to control the data input buffer circuit 123 and the data output buffer circuit 125 in response to some of the control signals. As stated above, the flash memory device 101 has been simplified to facilitate a basic understanding of the features of the memory. A more detailed understanding of flash memories is known to those skilled in the art.

Figure 1B:
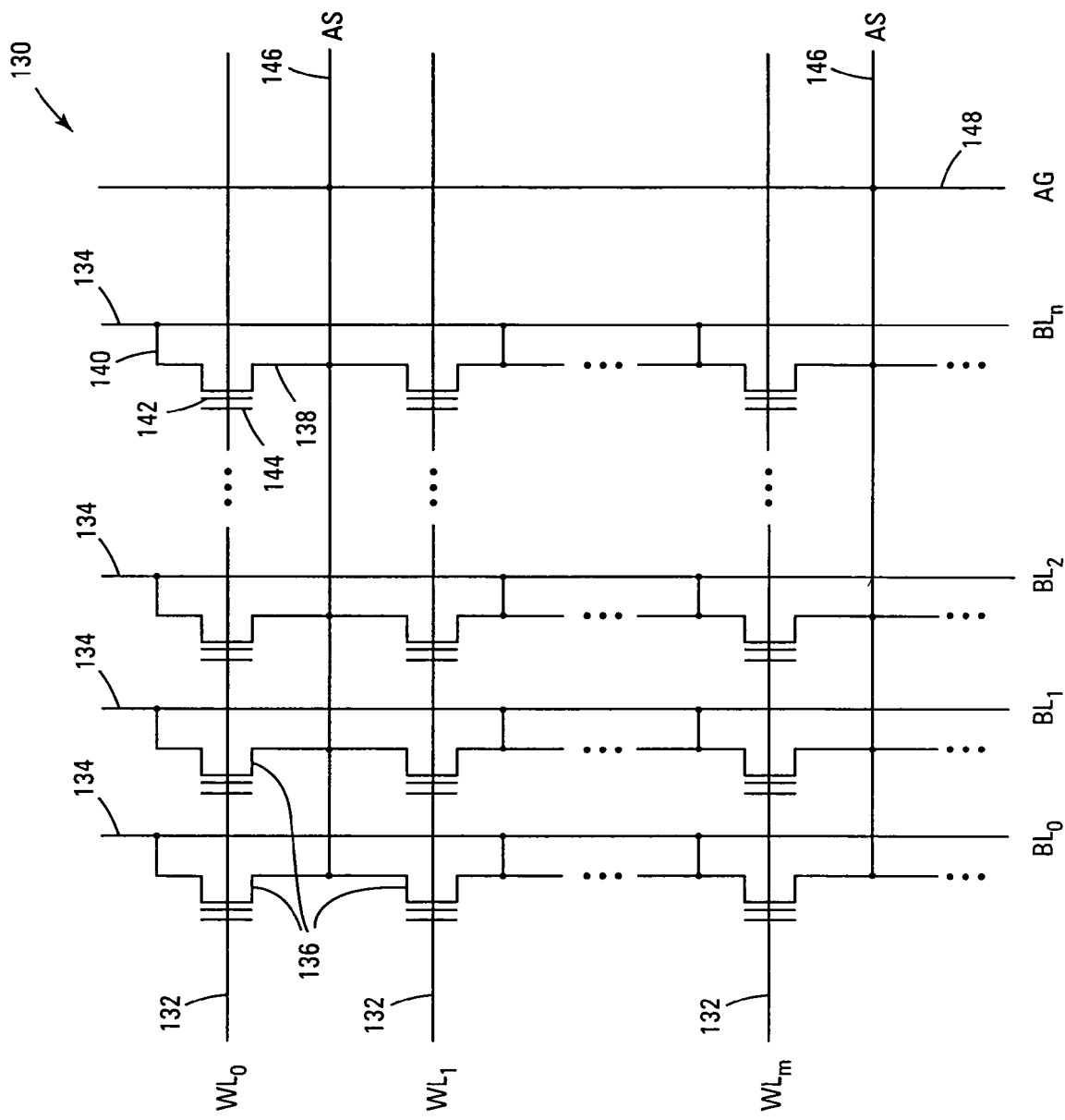
FIG. 1B is a schematic of a portion of a typical non-volatile memory main block as a portion of a memory array of a memory device of the type shown in FIG. 1A.

Arrays of flash memory cells are often configured as floating-gate transistors placed at the intersection of word lines and local bit lines. The word lines are coupled to the control gates of the floating-gate transistors. FIG. 1B is a schematic of a portion of a typical non-volatile memory main block 130 as a portion of the memory array 105.

The detail of main block 130 is provided to better understand the various embodiments of the invention. However, the invention is not limited to the specific floating-gate memory cell and layout described with reference to FIG. 1B.

As shown in FIG. 1B, the main block 130 includes word lines 132 and intersecting local bit lines 134. For ease of addressing in the digital environment, the number of word lines 132 and the number of local bit lines 134 are each some power of two, e.g., 256 word lines 132 by 4,096 local bit lines 134.

Floating-gate transistors 136 are located at each intersection of a word line 132 and a local bit line 134. The floating-gate transistors 136 represent the non-volatile memory cells for storage of data. Typical construction of such floating-gate transistors 136 include a source region 138 and a drain region 140 constructed from an $N^+$-type material of high impurity concentration formed in a P-type semiconductor substrate of low impurity concentration, a channel region formed between the source and drain, a floating gate 142, and a control gate 144. Floating gate 142 is isolated from the channel region by a tunneling dielectric and from the control gate 144 by an intergate dielectric. The materials of construction are not critical to the invention, but commonly include doped polysilicon for the gate materials, and silicon oxides, nitrides or oxynitrides for the dielectric materials. Floating-gate transistors 136 having their control gates 144 coupled to a word line 132 typically share a common source region 138 depicted as array source 146. To reduce resistance to each source region 138, each array source 146 is often coupled to a metal line to ground, such as array ground 148. As shown in FIG. 1B, floating-gate transistors 136 coupled to adjacent word lines 132 may share the same array source 146. Floating-gate transistors 136 have their drain regions 140 coupled to a local bit line 134. A column of the floating-gate transistors 136 are those transistors having their drain regions 140 commonly coupled to a given local bit line 134. A row of the floating-gate transistors 136 are those transistors having their control gates 144 commonly coupled to a given word line 132.

Figure 2:
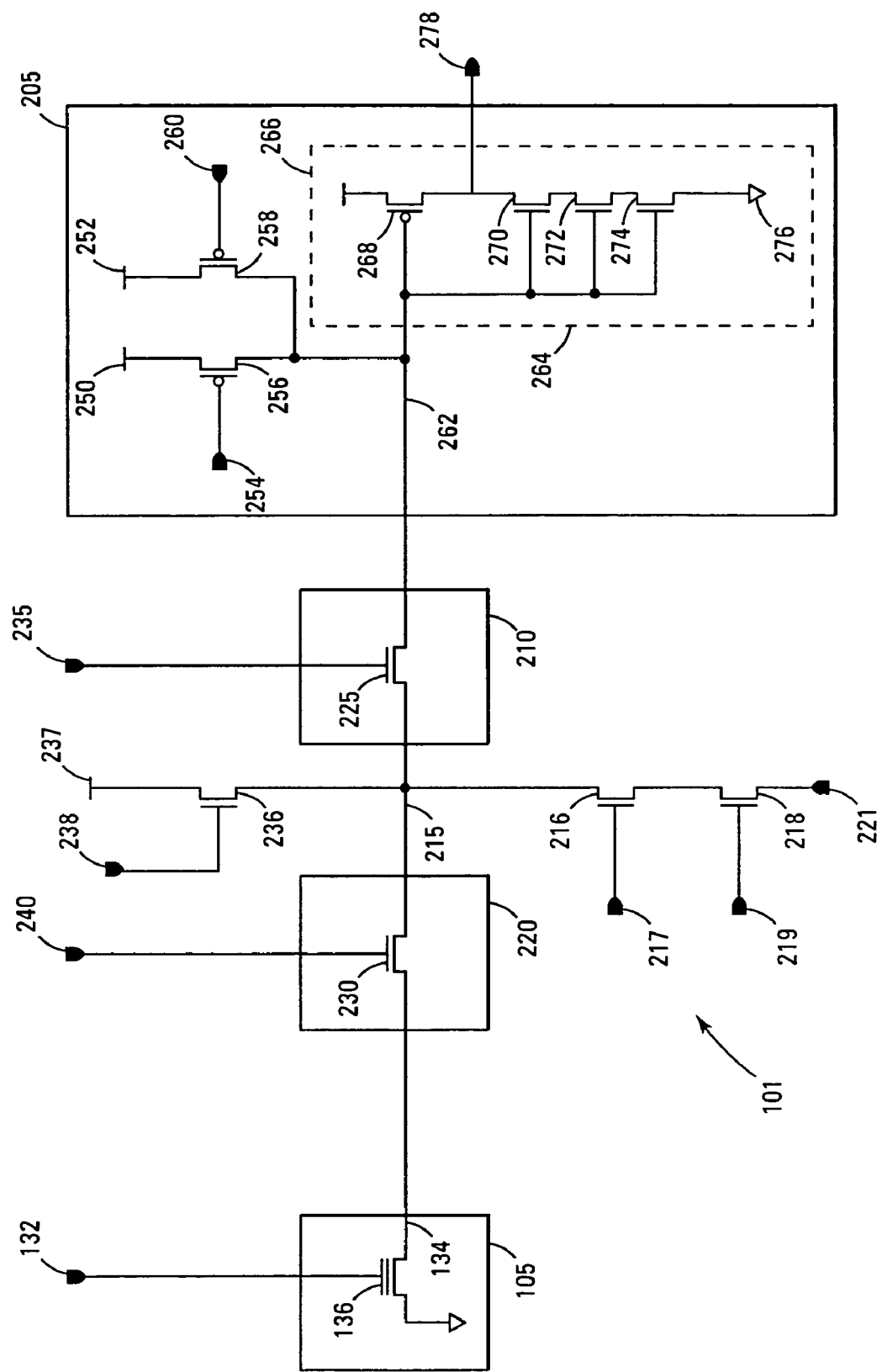
FIG. 2 is a schematic of a portion of a memory device showing sensing circuitry in accordance with the invention.

FIG. 2 is a schematic of a portion of a memory device 101 having sensing circuit in accordance with the invention. As shown in FIG. 2, a target memory cell 136 is selectively coupled to a sensing device 205 through its associated local bit line 134 and global bit line 215. As noted previously, there are generally many local bit lines 134 associated with a single global bit line 215 and many global bit lines 215 associated with a single sensing device 205 in typical high-density memory devices. The sensing device 205 is generally one of many sensing devices 205 contained in the sensing circuit 121 as depicted in FIG. 1A.

The global bit line 215 associated with the target memory cell 136 is coupled to its associated sensing device 205 using pass circuit 210. Pass circuit 2 10 is depicted as containing a single selective coupling device or pass transistor 225 providing the selective coupling between the global bit line 215 and the sensing device 205. The pass transistor 225 has a gate coupled to receive a control signal from node 235. Those skilled in the art of memory devices will recognize that pass circuit 210 would contain additional pass transistors associated with other global bit lines. Furthermore, additional pass transistors may be interposed between the global bit line 215 and the sensing device 205.

The local bit line 134 associated with the target memory cell 136 is coupled to its associated global bit line 215 using pass circuit 220. Pass circuit 220 is depicted as containing a single selective coupling device or pass transistor 230 providing the selective coupling between the local bit line 134 and the global bit line 215. The pass transistor 230 has a gate coupled to receive a control signal from node 240. Those skilled in the art of memory devices will recognize that pass circuit 220 would contain additional pass transistors associated with other local bit lines. Furthermore, additional pass transistors may be interposed between the local bit line 134 and the global bit line 215. Pass circuits 210 and 220 may represent a portion of the column select circuit 119 of FIG. 1A.

The sensing device 205 includes a first precharging path for selectively applying a first precharge potential to charge the local bit line 134, the global bit line 215, and the input node 262. The first precharging path is shown in FIG. 2 as the p-channel field-effect transistor (pFET) 256 coupled between a potential node 250 and the input node 262. The potential node 250 is coupled to receive the first precharge potential. The first precharge potential may be a supply potential, such as Vcc. The pFET 256 selectively couples the potential node 250 to the input node 262 in response to a control signal received at node 254.

In addition to the sensing device 205, the sensing circuit further includes a second precharging path for selectively applying a second precharge potential to charge the local bit line 134, the global bit line 215, and the input node 262. For one embodiment, the second precharging path is shown in FIG. 2 as the nFET 236 coupled between a potential node 237 and the global bit line 215. The potential node 237 is coupled to receive the second precharge potential. The nFET 236 selectively couples the potential node 237 to the global bit line 215 in response to a control signal received at node 238. It is preferred that the second precharging path be applied directly to the global bit line 215 to more rapidly charge its parasitic capacitances. For the typical architecture of many global bit lines 215 for each sensing device 205, the sensing circuit would include one second precharging path for each global bit line 215.

For one embodiment, the potential node 237 is the same potential node as potential node 250 and the first and second precharge potentials are the same potential. For another embodiment, the potential node 237 is physically separated from the potential node 250, but both are coupled to receive substantially the same potential. For yet another embodiment, the potential node 237 is physically separated from the potential node 250, and each is coupled to receive a different potential. The second precharging path preferably has a higher conductance than the first precharging path to more easily charge the higher capacitance of the global bit line.

The sensing device 205 further includes a reference current path for selectively applying a reference current to the input node 262. Ideally, a target memory cell 136 and its path to the sensing device 205 would exhibit a zero current draw if the floating-gate transistor of the target memory cell 136 were programmed, i.e., in a first programmed state, such that the input node 262 would remain at the precharge potential during sensing. However, some residual current may be expected, whether such residual current is due to leakage, depletion, or some other phenomena. This residual current could result in an erroneous indication that the target memory cell is erased, i.e., in a second programmed state. The reference current path provides a reference current to the input node 262 to compensate for such residual currents and to avoid erroneous indications of the second programmed state.

The reference current path is shown in FIG. 2 as the pFET 258 coupled between the potential node 252 and the input node 262. The potential node 252 is coupled to receive a supply potential, such as Vcc. The reference current should be less than a current flow through the target memory cell 136 if the target memory cell 136 is erased or in the second programmed state, yet more than the expected residual current. The reference current is controlled through the application of a reference current control signal to the gate of the pFET 258 from node 260. Varying the potential level of the reference current control signal will vary the conductance of the pFET 258, resulting in control of the current flow through the reference current path.

The sensing device 205 still further includes a sense inverter 264 having a threshold point. The sense inverter generates an output signal at output node 278 in response to a potential level at the input node 262 relative to the threshold point. The potential level of the input node 262 is indicative of the state of the local bit line 134.

The sense inverter 264 includes a p-channel stage having a pFET 268 coupled between a potential node 266 and the output node 278. The potential node 266 is coupled to receive a supply potential, such as Vcc. The supply potential represents a first logic level, such as a logic high level. The sense inverter 264 further includes an n-channel stage having at least one n-channel field-effect transistor (nFET) coupled between the output node 278 and a potential node 276. The potential node 276 is coupled to receive a ground potential, such as Vss. The ground potential represents a second logic level, such as a logic low level. For the embodiment of FIG. 2, the sense inverter 264 includes nFET 270, nFET 272 and nFET 274 coupled in series between the output node 278 and the potential node 276. The pFET 268, nFET 270, nFET 272 and nFET 274 each have a gate coupled to the input node 262. The multiple nFET devices in the sense inverter 264 are used to move the threshold point closer to the precharge potential. The combination of a low voltage p-channel stage and a weak n-channel stage in the sense inverter 264 can maintain the threshold point near the precharge potential. Other methods of altering the threshold point of the sense inverter 264 may be used, such as varying the sizing of the FET devices.

During sensing, if the target memory cell is in the second programmed state, the bit lines will be expected to drop to a potential below the precharge potential. The expected bit line potential is approximately the precharge potential minus the threshold voltage of the transistors minus some delta for ohmic drop across the bit lines. The threshold point of the sense inverter 264 must be some potential level higher than this expected bit line potential in order to reliably detect and amplify the data value of the target memory cell.

Operation of the memory device 101 proceeds generally as follows. The bit lines 134 and 215 are decoded and coupled to the input node 262 of a sensing device 205. The decoded bit lines may be thought of as a single bit line coupled to the target memory cell. The first precharging path and the second precharging path are activated to charge the bit line and the input node 262 to the precharge potential and the word line 132 of the target memory cell 136 is driven. In addition, a reference current is applied to the input node 262 of the sensing device 205 through the reference current path.

As the bit line is pulled up toward the first precharge potential, the second precharging path is deactivated while leaving the first precharging path activated. This isolates the global bit line 215 from the second precharge potential. The first precharging path is then deactivated to isolate the global bit line 215 from the first precharge potential while maintaining application of the reference current. The programmed state of the target memory cell 136 is then sensed and amplified by the sensing device 205. The data value at the output node 278 is latched and the memory device is returned to a low power mode.

For improved performance of the sensing device 205, it is important that the timing of the bit line precharging be controlled tightly. The precharging should be sufficient to completely charge the parasitics of the bit lines to provide consistent sensing operations. An insufficient precharge may lead to an erroneous indication of an erased state of the target memory cell. However, for improved access speed, this precharging should not be any longer than necessary to charge these parasitics. Timing of an operation phase such as the precharging phase is generally controlled by a timing signal or pulse. Pulse generators for generating a timing pulse often provide compensation for changes in supply voltage, but may exhibit unacceptable variation as a result of changes in ambient temperature. U.S. patent application Ser. No. 10/032,277, filed Dec. 21, 2001, entitled "Voltage and Temperature Compensated Pulse Generator," commonly assigned, and now U.S. Pat. No. 6,643,192, issued Nov. 4, 2003, describes methods and circuits for generating a timing pulse including compensation for supply voltage and ambient temperature.

Figure 3:
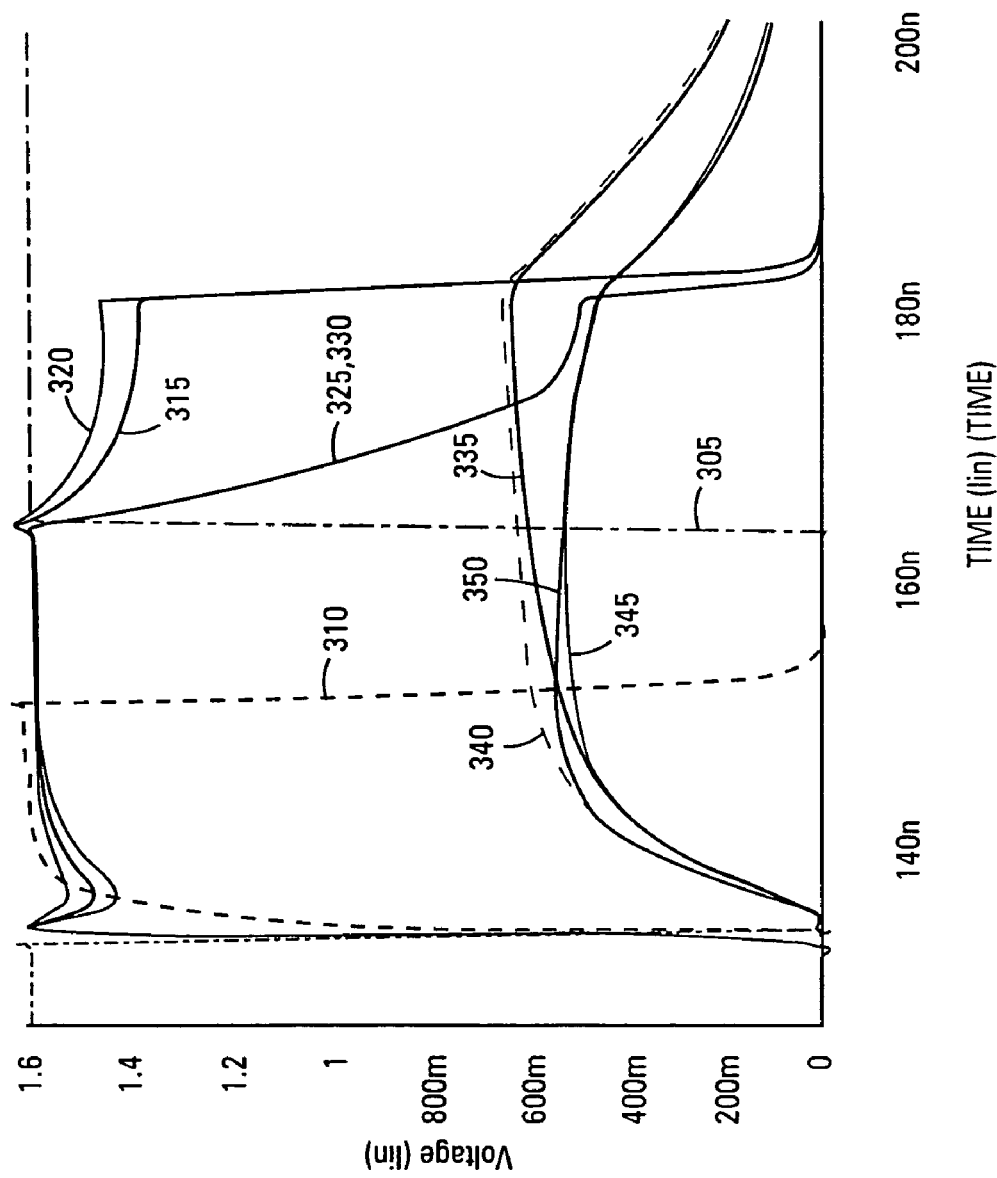
FIG. 3 is a signal diagram showing traces of various signals and potentials associated with the memory device of FIG. 2.

FIG. 3 is a signal diagram showing traces of various signals and potentials associated with the memory device 101 of FIG. 2 during a sensing operation. Signal 305 is the control signal applied to the control node 254. Signal 305 thus selectively activates the first precharging path. Signal 305 has a logic level to deactivate the pFET 256 prior to the beginning of the sensing operation. For the embodiment depicted in FIG. 3, this logic level corresponds to a potential of approximately 1.6V or the supply potential Vcc. Signal 310 is the control signal applied to the control node 238. Signal 310 thus selectively activates the second precharging path. Signal 310 has a logic level to deactivate the nFET 236 prior to the beginning of the sensing operation. For the embodiment depicted in FIG. 3, this logic level corresponds to a potential of approximately 0 volts or a ground potential.

At the beginning of the sensing operation, the bit line is precharged by transitioning signals 305 and 310 to logic levels appropriate to activate the first and second precharging paths, e.g., pFET 256 and nFET 236, respectively. As the precharging begins, the global bit line 215 and the input node 262 of the sensing device 205 will rapidly rise to the precharge potential. However, due to the relative capacitance of the global bit line 215 and the input node 262, the potential level of the global bit line 215 will rise more slowly. Prior to the completion of the precharging phase, the second precharging path is deactivated. For the example shown in FIG. 2, the second precharging path is deactivated by transitioning the signal 310 to a logic level capable of deactivating the nFET 236.

The second precharging path is preferably activated for a period of time sufficient to bring the global bit line 215 to within approximately 75% of its asymptotic value (e.g., Vcc minus $V_T$ of nFET 236) in the absence of conductance of the target memory cell 136, and more preferably to within approximately 90% of its asymptotic value. However, it is generally more practical to time the period of activation of the second precharging path as a fraction of the total precharging phase. For one embodiment, the second precharging path is activated for approximately 40% of the precharging phase. For another embodiment, the second precharging path is activated for at least approximately 50% of the precharging phase. For yet another embodiment, the second precharging path is activated for approximately 80% of the precharging phase. As the period of time for activation of the second precharging path approaches the total time of the precharging phase, and the potential level of the global bit line approaches its asymptotic value, care should be taken to avoid deactivating the pass circuit 210 as the $V_{GS}$ of the nFET 225 may approach its $V_T$. For the example shown in FIG. 3, the precharging phase has a length of approximately 30 nS while the second precharging path is activated for approximately 18 nS.

The traces of FIG. 3 present four cases of reading a target memory cell with and without using the second precharging path. For cases using the second precharging path for a portion of the precharging phase, the length of activation of the second precharging path is approximately 60% of the total time of the precharging phase. The four cases presented in FIG. 3 are: Control Case #1 of reading a first data value (e.g., "0" represented by a target memory cell 136 in a non-conductive state) using only the first precharging path; Example Case #1 of reading the first data value using the first and second precharging paths in accordance with an embodiment of the invention; Control Case #2 of reading a second data value (e.g., "1" represented by a target memory cell 136 in a conductive state) using only the first precharging path; and Example Case #2 of reading the second data value using the first and second precharging paths in accordance with an embodiment of the invention.

The potential levels on the input node 262 for Control Case #1, Example Case #1, Control Case #2 and Example Case #2 are represented in FIG. 3 by potential levels 315, 320, 325 and 330, respectively. As can be seen, the traces for the potential levels on the input node 262 are substantially similar until the end of the precharging phase. Because the relative capacitance of the input node 262 is low, this node rapidly rises to the precharge potential applied through the pFET 256 with or without use of the second precharging path.

The potential levels on the global bit line 215 for Control Case #1, Example Case #1, Control Case #2 and Example Case #2 are represented in FIG. 3 by potential levels 335, 340, 345 and 350, respectively. As can be seen in FIG. 3, the global bit line 215 will rise more rapidly toward its asymptotic value using the second precharging path. Use of two precharging paths thus allows for a faster precharge while still providing protection from overshoot by deactivating the second precharging path during the precharging phase. Additionally, use of the second precharging path results in a larger potential differential between reading the first and second data values, thus providing a larger sensing margin.

Although the second precharging path was shown to be a dedicated path for one embodiment, it is possible to utilize existing circuitry to form the second precharging path. For example, a programming path is provided in memory devices to apply a programming potential to a target memory cell during a write operation. Referring back to FIG. 2, this programming path is shown as nFETs 216 and 218 receiving control signals from control nodes 217 and 219, respectively. The programming potential is received from node 221. Because the programming potential is typically pumped up from the supply potential, the transistors of the programming path are typically high-voltage transistors.

The programming path is normally deactivated during a sensing operation. Using appropriate logic, the programming path can be made to be activated during a portion of the precharging phase. By applying a low-voltage control signal to control nodes 217 and 219, for the example shown in FIG. 2, the programming path can be used as the second precharging path to rapidly bring the global bit line 215 up toward an asymptotic potential level, e.g., a potential level approximately equal to Vcc minus $V_T$ of the nFET 225 of the pass circuit 210. The low-voltage control signal is chosen such that the nFETs 216 and 218 would have a $V_{GS}$ insufficient to activate the transistors as the potential level of the global bit line 215 approaches the asymptotic value. Choosing the low-voltage control signal in this manner helps protect against overshoot.

CONCLUSION

Sensing circuits for sensing a programmed state of a floating-gate memory cell have been described for use in memory devices. Sensing circuits in accordance with the various embodiments include a first precharging path for applying a first precharge potential to the input node of a sensing device for precharging bit lines prior to sensing the programmed state of the floating-gate memory cell. Sensing circuits in accordance with the various embodiments further include a second precharging path for applying a second precharge potential to a target global bit line for precharging bit lines prior to sensing the programmed state of the floating-gate memory cell. The second precharging path is activated during only a portion of the precharging phase of a sensing operation to bring the bit lines rapidly up toward an asymptotic potential level. The second precharging path is thus deactivated prior to deactivating the first precharging path.

Although specific embodiments have been illustrated and described herein, it will be appreciated by those of ordinary skill in the art that any arrangement that is calculated to achieve the same purpose may be substituted for the specific embodiments shown. Many adaptations of the invention will be apparent to those of ordinary skill in the art. Accordingly, this application is intended to cover any adaptations or variations of the invention. It is manifestly intended that this invention be limited only by the following claims and equivalents thereof.

What is claimed is:

1. A sensing circuit, comprising:
   a sensing device having an input node and a first precharging path coupled to the input node; and
   at least one second precharging path, wherein each second precharging path is coupled to the input node through a pass circuit;
   wherein the first precharging path and the at least one second precharging path are adapted to be concurrently activated during a first portion of a sensing operation while the pass circuit is activated;
   wherein the at least one second precharging path is adapted to be deactivated during a second portion of the sensing operation while the pass circuit and the first precharging path remain activated from the first portion of the sensing operation; and
   wherein the first precharging path and the at least one second precharging path are adapted to be concurrently deactivated during a third portion of the sensing operation while the pass circuit remains activated from the second portion of the sensing operation.

2. The sensing circuit of claim 1, wherein the first precharging path comprises a p-channel field-effect transistor coupled between a first potential node and the input node.

3. The sensing circuit of claim 2, wherein each second precharging path comprises an n-channel field-effect transistor coupled between a second potential node and the pass circuit.

4. The sensing circuit of claim 1, wherein each second precharging path comprises an n-channel field-effect transistor coupled between a second potential node and the pass circuit.

5. The sensing circuit of claim 1, wherein the sensing device further comprises a sense inverter having a threshold point, wherein the sense inverter is adapted to generate an output signal at an output node in response to a potential level at the input node relative to the threshold point.

6. The sensing circuit of claim 1, wherein the sensing device further comprises a reference current path for selectively applying a reference current to the input node.

7. The sensing circuit of claim 6, wherein the reference current path comprises a p-channel field-effect transistor coupled between a potential node and the input node.

8. A flash memory device, comprising:
a global bit line;
a sensing device for sensing a programmed state of a target memory cell, wherein the sensing device includes an input node selectively coupled to the global bit line and wherein the sensing device includes a first precharging path coupled to the input node for precharging the input node and the global bit line during a sensing operation; and
a second precharging path coupled to the global bit line for precharging the input node and the global bit line during the sensing operation;
wherein the first precharging path and the second precharging path are responsive to different control signals to be independently activated.

9. The flash memory device of claim 8, wherein the first precharging path comprises a p-channel field-effect transistor coupled between a first potential node and the input node.

10. The flash memory device of claim 9, wherein the second precharging path comprises an n-channel field-effect transistor coupled between a second potential node and a pass circuit that couples the global bit line to the input node.

11. The flash memory device of claim 9, wherein the second precharging path comprises one or more high-voltage n-channel field-effect transistors as part of a programming path of the flash memory device, wherein the one or more high-voltage n-channel field-effect transistors are coupled to receive control signals adapted to activate the one or more high-voltage n-channel field-effect transistors during the sensing operation and during a write operation of the flash memory device.

12. A flash memory device, comprising:
an array of flash memory cells;
a plurality of sensing devices each having an input node and a first precharging path coupled to the input node, wherein each input node is selectively coupled to one of a plurality of global bit lines, wherein each global bit line is selectively coupled to one of a plurality of local bit lines, and wherein each local bit line is coupled to at least one of the flash memory cells; and
a plurality of second precharging paths each coupled to one of the global bit lines in a one-to-one relationship;
wherein each of the first precharging paths is coupled to selectively apply a first precharge potential to its associated input node;
wherein each of the second precharging paths is coupled to selectively apply a second precharge potential to its associated global bit line; and
wherein each of the first precharging paths is adapted to apply the first precharge potential to its associated input node during a sensing operation on the associated input node while a second precharging path is applying the second precharge potential to a global bit line actively coupled to the associated input node; and
wherein each of the first precharging paths is adapted to continue applying the first precharge potential to its associated input node during the sensing operation on the associated input node after the second precharging path isolates the global bit line actively coupled to the associated input node from the second precharge potential.

13. The flash memory device of claim 12, wherein each first precharging path comprises a p-channel field-effect transistor coupled between a first potential node and the input node of its associated sensing device.

14. The flash memory device of claim 13, wherein each second precharging path comprises an n-channel field-effect transistor coupled between a second potential node and its associated global bit line.

15. The flash memory device of claim 13, wherein each second precharging path comprises a programming path of the flash memory device that is coupled to receive logic adapted to selectively activate the programming path during both a write operation and a sensing operation of the flash memory device.

16. The flash memory device of claim 12, wherein each input node is selectively coupled to one of a plurality of global bit lines through a pass circuit.

17. The flash memory device of claim 12, wherein each global bit line is selectively coupled to one of a plurality of local bit lines through a pass circuit.

18. A flash memory device, comprising:
a global bit line coupled to a local bit line through a first pass circuit, the local bit line coupled to a target memory cell of the flash memory device;
a sensing device for sensing a programmed state of the target memory cell, wherein the sensing device includes an input node selectively coupled to the global bit line through a second pass circuit and wherein the sensing device includes a p-channel field-effect transistor coupled between a first potential node and the input node; and
a second precharging path coupled to the global bit line for precharging the input node and the global bit line during the sensing operation, the second precharging path comprising an n-channel field-effect transistor coupled between a second potential node and the second pass circuit;
wherein the p-channel field-effect transistor and the second precharging path are adapted to be concurrently activated during a first portion of a sensing operation while the second pass circuit is activated;
wherein the second precharging path is adapted to be deactivated during a second portion of the sensing operation while the second pass circuit and the p-channel field-effect transistor remain activated from the first portion of the sensing operation; and
wherein the p-channel field-effect transistor and the second precharging path are adapted to be concurrently deactivated during a third portion of the sensing operation while the second pass circuit remains activated from the second portion of the sensing operation.

19. The flash memory device of claim 18, wherein the second potential node is the same node as the first potential node.

20. The flash memory device of claim 18, wherein the sensing device further comprises a sense inverter having a threshold point, wherein the sense inverter is adapted to generate an output signal at an output node in response to a potential level at the input node relative to the threshold point.

21. The flash memory device of claim 20, wherein the sense inverter includes a p-channel stage coupled between a third potential node and the output node.

22. The flash memory device of claim 21, wherein the sense inverter further includes an n-channel stage coupled between the output node and a fourth potential node.

23. The flash memory device of claim 18, wherein the sensing device further comprises a reference current path for selectively applying a reference current to the input node.

24. The flash memory device of claim 18, further comprising a programming path for applying a programming potential to the target memory cell during a write operation, the programming path comprising one or more high-voltage n-channel field-effect transistors coupled between a third potential node and the second pass circuit.

* * * * *